United States Patent
Tsurumi et al.

(10) Patent No.: US 12,266,730 B2
(45) Date of Patent: Apr. 1, 2025

(54) NITRIDE SEMICONDUCTOR DEVICE

(71) Applicant: Panasonic Corporation, Osaka (JP)

(72) Inventors: Naohiro Tsurumi, Kyoto (JP); Daisuke Shibata, Kyoto (JP); Satoshi Tamura, Osaka (JP)

(73) Assignee: PANASONIC HOLDINGS CORPORATION, Osaka (JP)

( * ) Notice: Subject to any disclaimer, the term of this patent is extended or adjusted under 35 U.S.C. 154(b) by 428 days.

(21) Appl. No.: 17/763,536

(22) PCT Filed: Aug. 11, 2020

(86) PCT No.: PCT/JP2020/030629
§ 371 (c)(1),
(2) Date: Mar. 24, 2022

(87) PCT Pub. No.: WO2021/070469
PCT Pub. Date: Apr. 15, 2021

(65) Prior Publication Data
US 2022/0344518 A1    Oct. 27, 2022

(30) Foreign Application Priority Data
Oct. 9, 2019    (JP) .................................. 2019-185612

(51) Int. Cl.
*H01L 29/808*    (2006.01)
*H01L 29/20*     (2006.01)
(Continued)

(52) U.S. Cl.
CPC ...... *H01L 29/8083* (2013.01); *H01L 29/2003* (2013.01); *H01L 29/7788* (2013.01); *H01L 29/8122* (2013.01); *H02M 3/158* (2013.01)

(58) Field of Classification Search
None
See application file for complete search history.

(56) References Cited

U.S. PATENT DOCUMENTS

2010/0187569 A1* 7/2010 Renaud ............... H01L 29/7788
257/190
2011/0114916 A1* 5/2011 Yoshizumi ............. B82Y 20/00
257/E31.032
(Continued)

FOREIGN PATENT DOCUMENTS

JP    2011-035066 A    2/2011
JP    2011-035072 A    2/2011
(Continued)

OTHER PUBLICATIONS

International Search Report (ISR) issued on Oct. 27, 2020 in International (PCT) Patent Application No. PCT/JP2020/030629, with English translation.

*Primary Examiner* — Asok K Sarkar
(74) *Attorney, Agent, or Firm* — Rimon P.C.

(57) ABSTRACT

A nitride semiconductor device includes: a substrate; a nitride semiconductor layer above the substrate; a high-resistance layer above the nitride semiconductor layer; a p-type nitride semiconductor layer above the high-resistance layer; a first opening penetrating through the p-type nitride semiconductor layer and the high-resistance layer to the nitride semiconductor layer; an electron transport layer and an electron supply layer covering an upper portion of the p-type nitride semiconductor layer and the first opening; a gate electrode above the electron supply layer; a source electrode in contact with the electron supply layer; a second opening penetrating through the electron supply layer and the electron transport layer to the p-type nitride semiconductor layer; a potential fixing electrode in contact with the p-type nitride semiconductor layer at a bottom part of the second opening; and a drain electrode.

10 Claims, 11 Drawing Sheets

(51) Int. Cl.
*H01L 29/778* (2006.01)
*H01L 29/812* (2006.01)
*H02M 3/158* (2006.01)

(56) References Cited

U.S. PATENT DOCUMENTS

| | | |
|---|---|---|
| 2011/0204381 A1 | 8/2011 | Okada et al. |
| 2012/0181548 A1 | 7/2012 | Okada et al. |
| 2013/0168739 A1 | 7/2013 | Kiyama et al. |
| 2015/0194512 A1 | 7/2015 | Ohki et al. |
| 2016/0118491 A1 | 4/2016 | Okita et al. |
| 2016/0329421 A1 | 11/2016 | Shibata et al. |

FOREIGN PATENT DOCUMENTS

| | | |
|---|---|---|
| JP | 2011-082397 A | 4/2011 |
| JP | 4737471 B2 | 5/2011 |
| JP | 2012-084739 A | 4/2012 |
| JP | 2015-130436 A | 7/2015 |
| JP | 6511645 B2 | 4/2019 |
| WO | 2015/004853 A1 | 1/2015 |
| WO | 2015/122135 A1 | 8/2015 |

\* cited by examiner

NITRIDE SEMICONDUCTOR DEVICE

CROSS-REFERENCE OF RELATED APPLICATION

This application is the U.S. National Phase under 35 U.S.C. § 371 of International Patent Application No. PCT/JP2020/030629, filed on Aug. 11, 2020, which in turn claims the benefit of Japanese Application No. 2019-185612, filed on Oct. 9, 2019, the entire disclosures of which Applications are incorporated by reference herein.

TECHNICAL FIELD

The present disclosure relates to a nitride semiconductor device.

BACKGROUND ART

Nitride semiconductors, typified by gallium nitride (GaN), are wide-gap semiconductors having large band-gaps, and feature greater breakdown fields and higher electrode saturated drift velocities than compound semiconductors including, for example, gallium arsenide (GaAs) or silicon (Si) semiconductors. For example, band gaps of GaN and aluminum nitride (AlN) are 3.4 eV and 6.2 eV at room temperature, respectively. As such, power transistors using nitride semiconductors, which are useful in achieving higher outputs and breakdown voltages, are being researched and developed. For example, Patent Literature (PTL) 1 discloses a vertical field-effect transistor (FET) including a GaN semiconductor layer.

CITATION LIST

Patent Literature

[PTL 1] Japanese Patent No. 4737471

SUMMARY OF INVENTION

Technical Problem

If the conventional vertical FET is used for a power converter circuit, a potential on the drain side may become lower than a potential on the source side when the conventional vertical FET is OFF, causing a great current to flow from the source to the drain, that is, a reverse conductive operation may occur. With the conventional vertical FET, there is a problem in that a breakdown voltage decreases after the reverse conductive operation.

In view of this, the present disclosure provides a nitride semiconductor device capable of suppressing a decrease in breakdown voltage due to a reverse conductive operation.

Solution to Problem

A nitride semiconductor device according to one aspect of the present disclosure includes: a substrate; a first nitride semiconductor layer above the substrate; a first high-resistance layer above the first nitride semiconductor layer, the first high-resistance layer having a resistance higher than a resistance of the first nitride semiconductor layer; a first p-type nitride semiconductor layer above the first high-resistance layer; a first opening penetrating through the first p-type nitride semiconductor layer and the first high-resistance layer to the first nitride semiconductor layer; an electron transport layer and an electron supply layer provided in stated order from a substrate side, the electron transport layer and the electron supply layer covering an upper portion of the first p-type nitride semiconductor layer and the first opening; a gate electrode above the electron supply layer and covering the first opening; a source electrode away from the gate electrode and in contact with the electron supply layer; a second opening penetrating through the electron supply layer and the electron transport layer to the first p-type nitride semiconductor layer; a potential fixing electrode in contact with the first p-type nitride semiconductor layer at a bottom part of the second opening; and a drain electrode below the substrate.

A nitride semiconductor device according to another aspect of the present disclosure includes: a substrate; a first nitride semiconductor layer above the substrate; a first p-type nitride semiconductor layer above the first nitride semiconductor layer; a first opening penetrating through the first p-type nitride semiconductor layer to the first nitride semiconductor layer; an electron transport layer and an electron supply layer provided in stated order from a substrate side, the electron transport layer and the electron supply layer covering an upper portion of the first p-type nitride semiconductor layer and the first opening; a gate electrode above the electron supply layer and covering the first opening; a source electrode away from the gate electrode and in contact with the electron supply layer; a second opening penetrating through the electron supply layer and the electron transport layer to the first p-type nitride semiconductor layer; a potential fixing electrode in contact with the first p-type nitride semiconductor layer at a bottom part of the second opening; and a drain electrode below the substrate. The potential fixing electrode includes a material in Schottky contact with the first p-type nitride semiconductor layer.

A nitride semiconductor device according to still another aspect of the present disclosure includes: a substrate; a first nitride semiconductor layer above the substrate; a first p-type nitride semiconductor layer above the first nitride semiconductor layer; a first opening penetrating through the first p-type nitride semiconductor layer to the first nitride semiconductor layer; an electron transport layer and an electron supply layer provided in stated order from a substrate side, the electron transport layer and the electron supply layer covering an upper portion of the first p-type nitride semiconductor layer and the first opening; a gate electrode above the electron supply layer and covering the first opening; a source electrode away from the gate electrode and in contact with the electron supply layer; a second opening penetrating through the electron supply layer and the electron transport layer to the first p-type nitride semiconductor layer; a potential fixing electrode in contact with the first p-type nitride semiconductor layer at a bottom part of the second opening; and a drain electrode below the substrate. A contact portion of the first p-type nitride semiconductor layer which is in contact with the potential fixing electrode has a thickness greater than or equal to 50 percent of a thickness of a non-contact portion of the first p-type nitride semiconductor layer which is not in contact with the potential fixing electrode, and the thickness of the non-contact portion is greater than or equal to 400 nm.

Advantageous Effects of Invention

According to the present disclosure, it is possible to provide a nitride semiconductor device capable of suppressing a decrease in breakdown voltage due to a reverse conductive operation.

DESCRIPTION OF EMBODIMENTS (Underlying Knowledge Forming the Basis of the Present Disclosure)

The inventors of the present disclosure discovered that the conventional vertical transistor described above in the "Background Art" section has the following problems.

Figure 1:
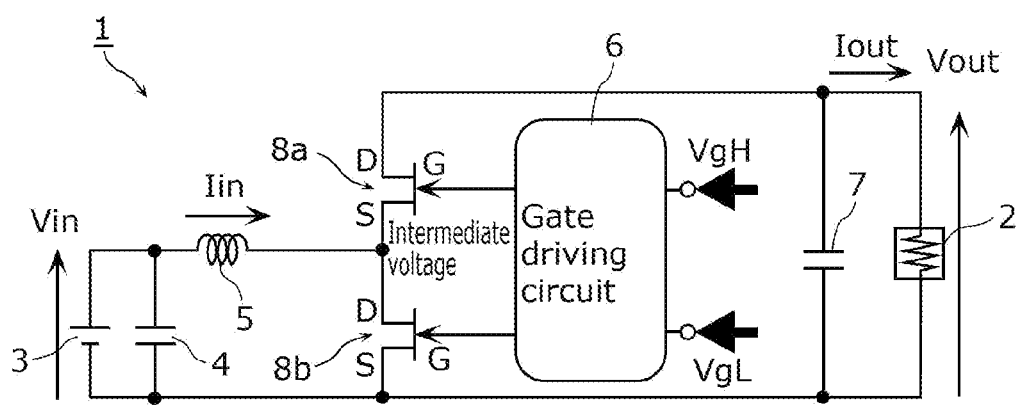
FIG. 1 is a circuit diagram of a general power converter circuit.

FIG. 1 is a circuit diagram of a general power converter circuit. Power converter circuit 1 shown by FIG. 1 is a step-up circuit. For example, power converter circuit 1 generates output voltage Vout of 400 V by stepping up power supply voltage Vin of 100 V generated by power source 3, and supplies generated output voltage Vout to load 2.

Power converter circuit 1 includes capacitor 4, inductor 5, gate driving circuit 6, capacitor 7, and two FETs 8a and 8b. The source of FET 8a is connected to the drain of FET 8b. Power source 3 is connected to a connecting point between two FETs 8a and 8b via inductor 5. Gate driving circuit 6 exclusively switches two FETs 8a and 8b between ON and OFF. For example, gate driving circuit 6 supplies a complementary pulse width modulation (PWM) signal to the gate of each of FETs 8a and 8b.

Power is accumulated in inductor 5 by switching FET 8a OFF and FET 8b ON. The power accumulated in inductor 5 is released by switching FET 8a ON and FET 8b OFF, and output voltage Vout higher than power supply voltage Vin is supplied to load 2.

When FETs 8a and 8b are switched between ON and OFF, both may be switched ON or OFF momentarily at the same time. In this case, a reverse conductive operation occurs in each of FETs 8a and 8b. To put it another way, a potential on the drain side becomes lower than a potential on the source side, causing a great current to flow from the source to the drain.

As a result of the research by the inventors, they discovered that in a vertical FET, after a great current is caused to flow by a reverse conductive operation, a breakdown voltage of the vertical FET decreases. This decrease in breakdown voltage, which did not occur in a horizontal FET in which only a device surface layer is used as a current path, is a problem unique to the vertical FET.

Figure 2:
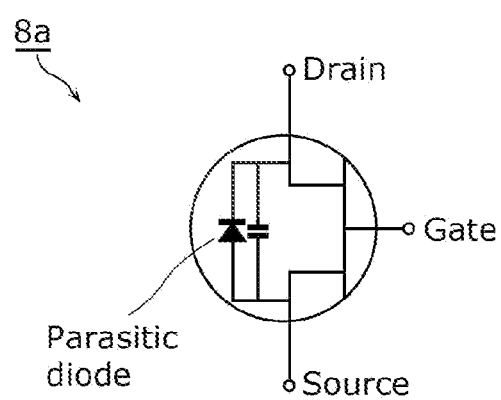
FIG. 2 is a circuit diagram illustrating an equivalent circuit of a vertical FET.

FIG. 2 is a circuit diagram illustrating an equivalent circuit of a vertical FET. As shown by FIG. 2, the vertical FET includes a parasitic diode between the source and the drain. The parasitic diode is a parasitic p-n diode formed of a parasitic p-n junction of the vertical FET.

As a result of the repeated research by the inventors, they discovered that a decrease in breakdown voltage occurs when a great current flows through the parasitic p-n diode of the vertical FET. Accordingly, the inventors found out the importance of suppressing electrical conduction to the parasitic p-n diode or a process technique when the source electrode is made into contact with a GaN layer, in order to suppress the decrease in breakdown voltage.

In view of the above, a nitride semiconductor device according to one aspect of the present disclosure includes: a substrate; a first nitride semiconductor layer above the substrate; a first high-resistance layer above the first nitride semiconductor layer, the first high-resistance layer having a resistance higher than a resistance of the first nitride semiconductor layer; a first p-type nitride semiconductor layer above the first high-resistance layer; a first opening penetrating through the first p-type nitride semiconductor layer and the first high-resistance layer to the first nitride semiconductor layer; an electron transport layer and an electron supply layer provided in stated order from a substrate side, the electron transport layer and the electron supply layer covering an upper portion of the first p-type nitride semiconductor layer and the first opening; a gate electrode above the electron supply layer and covering the first opening; a source electrode away from the gate electrode and in contact with the electron supply layer; a second opening penetrating through the electron supply layer and the electron transport layer to the first p-type nitride semiconductor layer; a potential fixing electrode in contact with the first p-type nitride semiconductor layer at a bottom part of the second opening; and a drain electrode below the substrate.

The first high-resistance layer is between the first nitride semiconductor layer and the first p-type nitride semiconductor layer. The first nitride semiconductor layer is formed usually using an n-type nitride semiconductor. Accordingly, the first high-resistance layer makes it possible to block a current path of a parasitic p-n diode formed between the first nitride semiconductor layer and the first p-type nitride semiconductor layer. As a result, since it is possible to prevent a great current from flowing through the parasitic p-n diode at time of a reverse conductive operation, it is possible to suppress a decrease in breakdown voltage due to the reverse conductive operation.

For example, the first high-resistance layer may be a GaN layer containing carbon. Alternatively, for example, the first high-resistance layer may be an undoped GaN layer.

With this configuration, as with the first nitride semiconductor layer and the first p-type nitride semiconductor layer, it is possible to continuously form the first high-resistance layer through epitaxial growth. Since impurities etc. are less likely to be mixed in an interface of each of the first nitride semiconductor layer, the first high-resistance layer, and the first p-type nitride semiconductor layer, it is possible to suppress the characteristic degradation of the nitride semiconductor device. It should be noted that it is possible to achieve GaN in a resistance state higher than a resistance state of undoped GaN by causing GaN to contain carbon.

For example, the potential fixing electrode may include a material in Schottky contact with the first p-type nitride semiconductor layer.

With this configuration, it is possible to form a Schottky barrier diode using the source electrode and the first p-type nitride semiconductor layer. A rise voltage of the parasitic p-n diode is high due to the reverse characteristics of the Schottky barrier diode, compared to when the source electrode and the first p-type nitride semiconductor layer are in ohmic contact. It should be noted that the rise voltage of the parasitic p-n diode is a source-drain voltage when a current starts to flow through the parasitic p-n diode. Accordingly, it is possible to prevent the current from flowing through the parasitic p-n diode and the decrease in breakdown voltage.

For example, a contact portion of the first p-type nitride semiconductor layer which is in contact with the potential fixing electrode may have a thickness greater than or equal to 50 percent of a thickness of a non-contact portion of the first p-type nitride semiconductor layer which is not in contact with the potential fixing electrode, and the thickness of the non-contact portion may be greater than or equal to 400 nm.

With this configuration, it is possible to keep away from the parasitic p-n junction a damage layer when the second opening reaching the first p-type nitride semiconductor layer is formed. As a result, it is possible to suppress the decrease in breakdown voltage due to the damage layer.

For example, the nitride semiconductor device according to one aspect of the present disclosure may further include a second p-type nitride semiconductor layer between the gate electrode and the electron supply layer.

With this configuration, the second p-type nitride semiconductor layer makes it possible to decrease a carrier concentration immediately below the gate electrode, and it is possible to shift a threshold voltage of an FET toward the positive side. Accordingly, it is possible to allow the nitride semiconductor device to operate as a normally-off FET.

For example, the nitride semiconductor device according to one aspect of the present disclosure may further include a second high-resistance layer above the first p-type nitride semiconductor layer, the second high-resistance layer having a resistance higher than a resistance of the first p-type nitride semiconductor layer. The first opening may further penetrate through the second high-resistance layer, and the electron transport layer and the electron supply layer may cover an upper portion of the second high-resistance layer.

With this configuration, the second high-resistance layer makes it possible to prevent the electron transport layer, the first p-type nitride semiconductor layer, and the first nitride semiconductor layer from forming a parasitic bipolar transistor having a parasitic npn structure.

For example, the potential fixing electrode may be electrically connected to the source electrode.

With this configuration, since it is possible to stabilize a potential of the first p-type nitride semiconductor layer, it is possible to ensure a breakdown voltage.

Embodiments of the present disclosure will be described in detail hereinafter with reference to the drawings.

Note that the following embodiments describe comprehensive or specific examples of the present disclosure. The numerical values, shapes, materials, constituent elements, arrangements and connection states of constituent elements, steps, orders of steps, and the like in the following embodiments are merely examples, and are not intended to limit the present disclosure. Additionally, of the constituent elements in the following embodiments, constituent elements not denoted in the independent claims will be described as optional constituent elements.

Additionally, the drawings are schematic diagrams, and are not necessarily exact illustrations. As such, the scales and so on, for example, are not necessarily consistent from drawing to drawing. Furthermore, configurations that are substantially the same are given the same reference signs in the drawings, and redundant descriptions will be omitted or simplified.

Additionally, in the present specification, terms indicating relationships between elements, such as "parallel" or "perpendicular", terms indicating the shapes of elements, such as "rectangular", and numerical value ranges do not express the items in question in the strictest sense, but rather include substantially equivalent ranges, e.g., differences of several percent, as well.

Additionally, in the present specification, terms such as "above" and "below" do not indicate the upward direction (vertically upward) and the downward direction (vertically downward) in an absolute spatial sense, but rather are used as terms defining relative positional relationships based on layering orders in layered configurations. Moreover, terms such as "above" and "below" are used not only in cases where two constituent elements are disposed with an interval therebetween and another constituent element is present between the stated two constituent elements, but also in cases where two constituent elements are disposed in close contact with each other.

In the present specification, "AlGaN" refers to an $Al_xGa_{1-x}N$ ternary mixed crystal (where $0 \leq x \leq 1$). Hereinafter, for multidimensional mixed crystals, the arrangements of the respective constituent element signs are abbreviated, e.g., AlInN, GaInN and the like. For example, $Al_xGa_{1-x-y}In_yN$ (where $0 \leq x \leq 1$, $0 \leq y \leq 1$), which is an example of a nitride semiconductor, is abbreviated as "AlGaInN".

The following describes the embodiments of the present disclosure with reference to the drawings.

Embodiment 1

First, the configuration of a nitride semiconductor device according to Embodiment 1 will be described with reference to FIG. 3 and FIG. 4.

Figure 3:
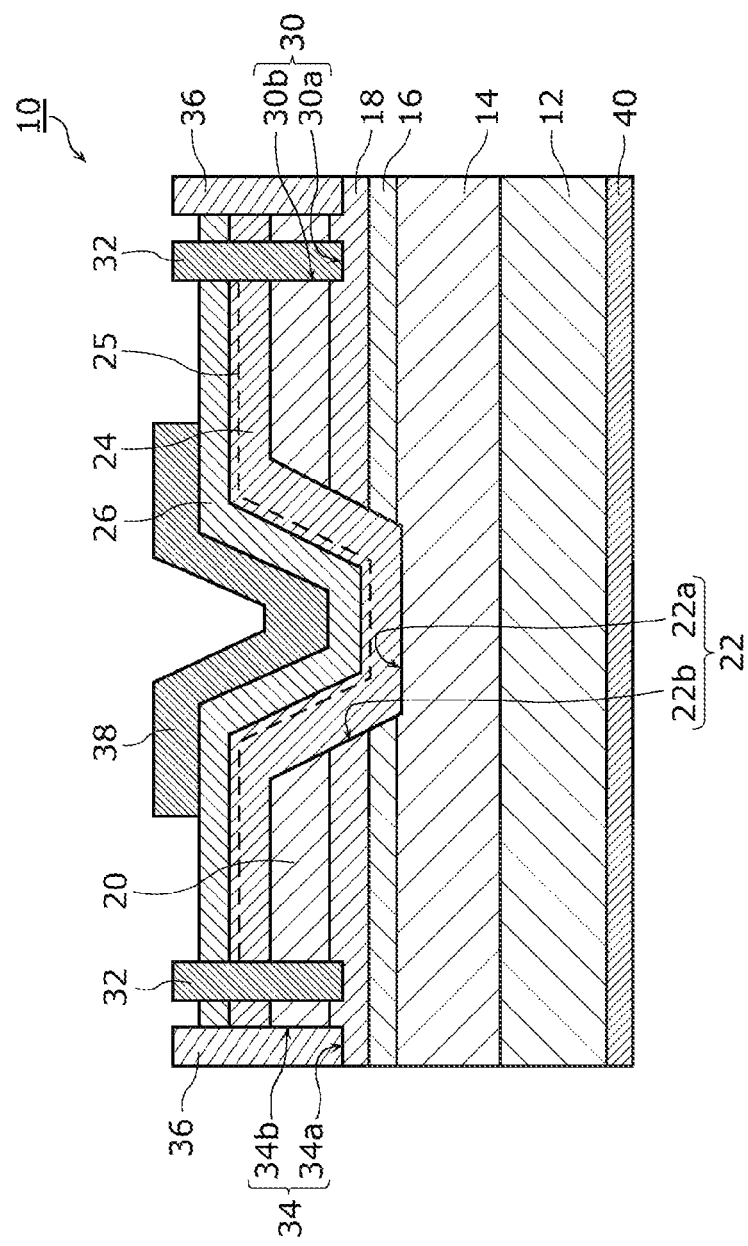
FIG. 3 is a cross-sectional view of a nitride semiconductor device according to Embodiment 1.

FIG. 3 is a cross-sectional view of nitride semiconductor device 10 according to the present embodiment. FIG. 4 is an enlarged partial cross-sectional view of the vicinity of potential fixing electrode 36 of nitride semiconductor device 10 according to the present embodiment.

Nitride semiconductor device 10 is a device having a layered structure of semiconductor layers that take a nitride semiconductor such as GaN or AlGaN as a primary component. Specifically, nitride semiconductor device 10 has a heterostructure of an AlGaN film (electron supply layer 26) and a GaN film (electron transport layer 24).

In the heterostructure of an AlGaN film and a GaN film, highly-concentrated two-dimensional electron gas (2DEG) is produced at the hetero interface due to spontaneous polarization or piezo polarization on a (0001) plane. The device therefore has a characteristic where a sheet carrier concentration of at least $1 \times 10^{13}$ cm$^{-2}$ is achieved at the hetero interface, even in an undoped state.

Nitride semiconductor device 10 is a field-effect transistor (FET) that uses two-dimensional electron gas 25 produced in electron transport layer 24 as a channel. Specifically, nitride semiconductor device 10 is what is known as a vertical FET.

As shown by FIG. 3, nitride semiconductor device 10 includes substrate 12, drift layer 14, high-resistance layer 16, first base layer 18, second base layer 20, gate opening 22, electron transport layer 24, electron supply layer 26, source opening 30, source electrode 32, electrode opening 34, potential fixing electrode 36, gate electrode 38, and drain electrode 40.

Substrate 12 is a substrate including a nitride semiconductor. Substrate 12 is, for example, a substrate formed from $n^+$-type GaN with a thickness of 300 µm and a donor concentration of $1\times10^{18}$ cm$^{-3}$. A top face of substrate 12 substantially coincides with the (0001) plane (c plane) of GaN.

It should be noted that n-type, $n^+$-type, $n^-$-type, p-type, $p^+$-type, and $p^-$-type each indicate a conductivity type of a semiconductor. n-type, $n^+$-type, and $n^-$-type are examples of a first conductivity type of a nitride semiconductor. p-type, $p^+$-type, and $p^-$-type are examples of a second conductivity type that differs from the first conductivity type in polarity.

Drift layer 14 is an example of a first nitride semiconductor layer provided above substrate 12. Drift layer 14 is, for example, a film formed from $n^-$-type GaN with a thickness of 8 µm. Drift layer 14 is provided so as to be in contact with the top face of substrate 12. A donor concentration of drift layer 14 is lower than the donor concentration of substrate 12, and is at least $1\times10^{15}$ cm$^{-3}$ and at most $1\times10^{17}$ cm$^{-3}$, for example. Additionally, drift layer 14 may include carbon (C). A carbon concentration of drift layer 14 is lower than a carbon concentration of high-resistance layer 16, and is at least $1\times10^{15}$ cm$^{-3}$ and at most $2\times10^{17}$ cm$^{-3}$, for example.

High-resistance layer 16 is an example of a first high-resistance layer provided above drift layer 14. High-resistance layer 16 has a resistance higher than a resistance of drift layer 14. High-resistance layer 16 is 200 nm thick, for example. High-resistance layer 16 is provided so as to be in contact with a top face of drift layer 14.

High-resistance layer 16 may include any material as long as high-resistance layer 16 is an insulating layer, a semi-insulating layer, or a semiconductor layer having fewer impurities. High-resistance layer 16 is, for example, a GaN layer containing carbon. The carbon concentration is, for example, at least $3\times10^{17}$ cm$^{-3}$, and may be preferably at least $1\times10^{18}$ cm$^{-3}$. High-resistance layer 16 may be formed by implanting, for example, magnesium (Mg), ferrum (Fe), or boron (B) ions into GaN. As long as other ion types used for ion implantation can produce a high-resistance state, the other ion types can achieve the same effect as the above ion types.

Moreover, high-resistance layer 16 may be an undoped GaN layer. It should be noted that the term "undoped" means that a material is not substantially doped with a dopant such as Si, oxygen (O), or Mg that changes the polarity of GaN to n-type or p-type. For example, an oxygen concentration and a silicon concentration of high-resistance layer 16 are lower than the carbon concentration, are at most $5\times10^{16}$ cm$^{-3}$, and may be preferably at most $2\times10^{16}$ cm$^{-3}$.

First base layer 18 is an example of a first p-type nitride semiconductor layer provided above high-resistance layer 16. First base layer 18 is, for example, a film formed from $p^-$-type GaN with a thickness of 400 nm. First base layer 18 serves as a blocking layer that prevents leak current flowing from drain electrode 40 toward source electrode 32 without passing through a channel. First base layer 18 is connected to potential fixing electrode 36 and is fixed to a predetermined potential.

Second base layer 20 is an example of an n-type nitride semiconductor layer provided above high-resistance layer 16. Second base layer 20 is a film formed from $n^+$-type GaN. Second base layer 20 has, for example, a thickness of 300 nm and a donor concentration of at least $1\times10^{17}$ cm$^{-3}$ and at most $3\times10^{18}$ cm$^{-3}$.

Gate opening 22 is an example of a first opening that penetrates through second base layer 20, first base layer 18, and high-resistance layer 16 to drift layer 14. As shown by FIG. 3, gate opening 22 includes bottom part 22a and side wall part 22b. Bottom part 22a is the top face of drift layer 14 and is located lower than an interface between high-resistance layer 16 and drift layer 14. Side wall part 22b includes an end face of each of second base layer 20, first base layer 18, and high-resistance layer 16, and part of the top face of drift layer 14. Side wall part 22b of gate opening 22 is inclined at an angle with respect to a main surface of substrate 12. For example, the cross-sectional shape of gate opening 22 is an inverted trapezoid, and more specifically, an inverted isosceles trapezoid. It should be noted that the cross-sectional shape of gate opening 22 may be a rectangle.

Electron transport layer 24 is provided so as to cover an upper portion of first base layer 18 and gate opening 22. Specifically, electron transport layer 24 is provided so as to be in contact with a top face of second base layer 20 and side wall part 22b and bottom part 22a of gate opening 22. Electron transport layer 24 is a first regrowth layer formed by regrowth of the nitride semiconductor after gate opening 22 is formed. Electron transport layer 24 has a substantially even thickness and curves along the shape of gate opening 22. Electron transport layer 24 is, for example, a film formed from undoped GaN having a thickness of 100 nm. It should be noted that electron transport layer 24 may be given n-type conductivity by being doped with Si etc.

Additionally, an approximately 1 nm-thick AlN layer may be provided, as a second regrowth layer, between electron transport layer 24 and electron supply layer 26. The AlN layer suppresses alloy scattering, which makes it possible to improve channel mobility. It should be noted that the AlN layer need not be provided, and electron transport layer 24 and electron supply layer 26 may be in direct contact with each other. Two-dimensional electron gas 25 to be a channel is produced at an interface between the AlN layer and electron transport layer 24.

Electron supply layer 26 is provided above electron transport layer 24. Specifically, electron supply layer 26 is provided along a top face of electron transport layer 24. Electron supply layer 26 is a third regrowth layer formed by regrowth of the nitride semiconductor after gate opening 22 is formed. Electron supply layer 26 has a substantially even thickness and curves along the curved shape of the top face of electron transport layer 24. Electron supply layer 26 is, for example, a film formed from AlGaN having a thickness of 50 nm.

Source opening 30 is an example of a third opening that penetrates through at least electron supply layer 26 and exposes at least part of an end face of electron transport layer 24, at a position distanced from gate electrode 38. Specifically, source opening 30 penetrates through electron supply layer 26, electron transport layer 24, and second base layer 20 to first base layer 18.

Figure 4:
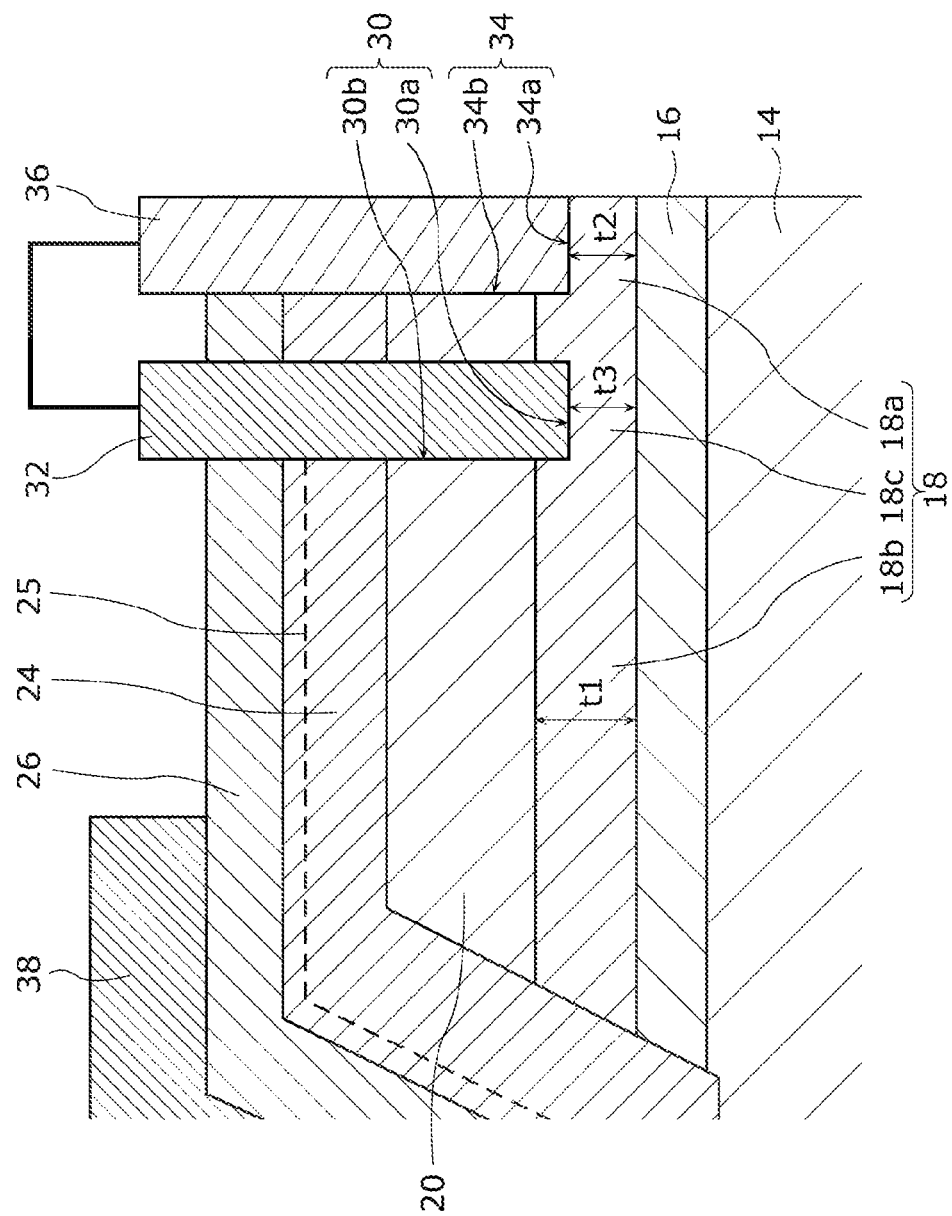
FIG. 4 is an enlarged partial cross-sectional view of the vicinity of a potential fixing electrode of the nitride semiconductor device according to Embodiment 1.

As shown by FIG. 3 and FIG. 4, source opening 30 includes bottom part 30a and side wall part 30b. Bottom part 30a is a top face of first base layer 18 and is located lower than an interface between first base layer 18 and second base layer 20. Side wall part 30b includes an end face of each of electron supply layer 26, electron transport layer 24, and second base layer 20, and part of the top face of first base layer 18. Side wall part 30b of source opening 30 is substantially vertical relative to the main surface of substrate 12. For example, the cross-sectional shape of source opening 30 is a rectangle, but may be an inverted trapezoid, and more specifically, an inverted isosceles trapezoid, as with gate opening 22.

Source electrode 32 is provided away from gate electrode 38 and is in contact with electron supply layer 26 and electron transport layer 24. Source electrode 32 is provided so as to cover bottom part 30a and side wall part 30b of source opening 30. Source electrode 32 is in direct contact with two-dimensional electron gas 25 at side wall part 30b of source opening 30.

Source electrode 32 is formed using a conductive material such as a metal. For example, a material which makes ohmic contact with an n-type semiconductor, such as titanium (Ti), can be used as the material of source electrode 32. Source electrode 32 may have a layered structure of a Ti film and an Al film. The layered structure in which the Al film is lower than the Ti film is represented as Ti/Al in the present specification.

Electrode opening 34 is an example of a second opening that penetrates through electron supply layer 26, electron transport layer 24, and second base layer 20 to first base layer 18. As shown by FIG. 3 and FIG. 4, electrode opening 34 includes bottom part 34a and side wall part 34b. Bottom part 34a is the top face of first base layer 18 and is located lower than the interface between first base layer 18 and second base layer 20. Side wall part 34b includes an end face of each of electron supply layer 26, electron transport layer 24, and second base layer 20, and part of the top face of first base layer 18. Side wall part 34b of electrode opening 34 is substantially vertical relative to the main surface of substrate 12. For example, the cross-sectional shape of electrode opening 34 is a rectangle, but may be an inverted trapezoid, and more specifically, an inverted isosceles trapezoid, as with gate opening 22.

Potential fixing electrode 36 is in contact with first base layer 18 at bottom part 34a of electrode opening 34. In the present embodiment, potential fixing electrode 36 is electrically connected to source electrode 32. It should be noted that FIG. 4 schematically shows the electrical connection between potential fixing electrode 36 and source electrode 32 using the thick broken line. The electrical connection method is not particularly limited, and, for example, source electrode 32 and potential fixing electrode 36 are electrically connected using a source pad (not shown) provided above source electrode 32.

Potential fixing electrode 36 is formed using a conductive material such as a metal. For example, a material which makes ohmic contact with first base layer 18, such as palladium (Pd), nickel (Ni), gold (Au), or tungsten silicide (WSi), can be used as the material of potential fixing electrode 36. In other words, in the present embodiment, potential fixing electrode 36 and source electrode 32 are each formed using a different material.

Gate electrode 38 is provided above electron supply layer 26 so as to cover gate opening 22. Gate electrode 38 is formed along a top face of electron supply layer 26 and in contact with the top face of electron supply layer 26, and is formed at a substantially uniform thickness.

Gate electrode 38 is formed using a conductive material such as a metal. Gate electrode 38 is formed using Pd, for example. It should be noted that a material which is brought into Schottky contact with an n-type semiconductor can be used as the material of gate electrode 38, and thus a Ni-based material, WSi, or Au can be used, for example. In addition, gate electrode 38 and potential fixing electrode 36 can be formed using the same material. For this reason, it is possible to form gate electrode 38 and potential fixing electrode 36 in the same process.

Drain electrode 40 is provided below substrate 12. Specifically, drain electrode 40 is provided in contact with a bottom face (a face opposite to a crystal growth face) of substrate 12. Drain electrode 40 is formed using a conductive material such as a metal. For example, as with the material of source electrode 32, a material which makes ohmic contact with an n-type semiconductor can be used as the material of drain electrode 40.

Each nitride semiconductor layer can be formed through epitaxial growth such as metalorganic vapor-phase epitaxy (MOVPE) or molecular beam epitaxy (MBE). Specifically, drift layer 14, high-resistance layer 16, first base layer 18, second base layer 20, electron transport layer 24, and electron supply layer 26 can be formed in stated order using an MOVPE device. Drift layer 14, high-resistance layer 16, first base layer 18, and second base layer 20 are continuously formed. Subsequently, after gate opening 22 is formed, electron transport layer 24 and electron supply layer 26 are continuously formed.

Gate opening 22, source opening 30, and electrode opening 34 are formed through photolithography and etching. Etching is, for example, dry etching. It should be noted that electrode opening 34 can be formed concurrently with source opening 30. For this reason, bottom part 34a of electrode opening 34 and bottom part 30a of source opening 30 are the same distance from substrate 12.

Source electrode 32, potential fixing electrode 36, gate electrode 38, and drain electrode 40 are each formed by forming a metal film through vapor deposition or sputtering etc. and patterning the metal film into a predetermined shape. Patterning can be performed through photolithography and etching. It should be noted that drain electrode 40 need not be patterned and may be provided on the entire bottom face of substrate 12.

[Characteristic Features and Effects]

The following describes characteristic features in above-described nitride semiconductor device 10.

In nitride semiconductor device 10, high-resistance layer 16 is inserted between drift layer 14 and first base layer 18. In other words, high-resistance layer 16 is inserted in a parasitic p-n junction of a parasitic p-n diode including n-type GaN (drift layer 14) and p-type GaN (first base layer 18), which makes it difficult for a current to flow between first base layer 18 and drift layer 14. In short, it is possible to block the current path of the parasitic p-n junction diode.

Accordingly, even when a potential on the drain side becomes lower than a potential on the source side in the case where nitride semiconductor device 10 is used as FET 8a or 8b of power converter circuit 1 shown by FIG. 1, it is possible to prevent a great current from flowing from source electrode 32 to drain electrode 40. Since a reverse conductive operation makes it difficult for a great current to flow through the parasitic p-n diode, it is possible to suppress a decrease in breakdown voltage due to the reverse conductive operation.

Moreover, the present embodiment is characterized by the thickness of first base layer 18. Specifically, as shown by FIG. 4, first base layer 18 includes contact portion 18a in contact with potential fixing electrode 36, and non-contact portion 18b not in contact with potential fixing electrode 36. In addition, first base layer 18 includes contact portion 18c in contact with source electrode 32.

Contact portion 18a is a portion of first base layer 18 and has the same plan view shape as bottom part 34a of electrode opening 34. Thickness t2 of contact portion 18a is a distance from a bottom face of first base layer 18 (specifically, an interface between first base layer 18 and high-resistance layer 16) to bottom part 34a.

Contact portion 18c is a portion of first base layer 18 and has the same plan view shape as bottom part 30a of source opening 30. Thickness t3 of contact portion 18c is a distance from the bottom face of first base layer 18 (specifically, the interface between first base layer 18 and high-resistance layer 16) to bottom part 30a.

Non-contact portion 18b is a portion of first base layer 18 which is exclusive of contact portions 18a and 18c. For example, non-contact portion 18b has the same plan view shape as a contact face between first base layer 18 and second base layer 20. Thickness t1 of non-contact portion 18b is a distance from the bottom face of first base layer 18 (specifically, the interface between first base layer 18 and high-resistance layer 16) to the top face of first base layer 18 (specifically, the interface between first base layer 18 and second base layer 20).

In the present embodiment, thickness t2 is at least 50 percent of thickness t1. Moreover, thickness t1 is at least 400 nm. Accordingly, thickness t2 is at least 200 nm. Thickness t3 is at least 50 percent of thickness t1. In the present embodiment, thickness t3 is equal to thickness t2. At least one of thickness t2 or thickness t3 may be at least 70 percent, 80 percent, or 90 percent of thickness t1. It should be noted that thickness t1, thickness t2, and thickness t3 may be equal to each other.

Each of bottom part 34a of electrode opening 34 and bottom part 30a of source opening 30 is damaged by dry etching when the opening is formed. In other words, a damage layer resulting from the dry etching is located in a surface part of each of contact portions 18a and 18c of first base layer 18. The damage layer includes crystal defects etc. and causes leak current.

In the present embodiment, it is ensured that thickness t2 of contact portion 18a and thickness t3 of contact portion 18c are at least 200 nm. This makes it possible to keep the damage layers located in the surface parts of contact portions 18a and 18c away from the parasitic p-n junction (high-resistance layer 16 located therewithin in the present embodiment). As a result, it is possible to suppress a decrease in breakdown voltage due to the damage layers.

[Variation 1]

Next, Variation 1 of Embodiment 1 will be described.

Figure 5:
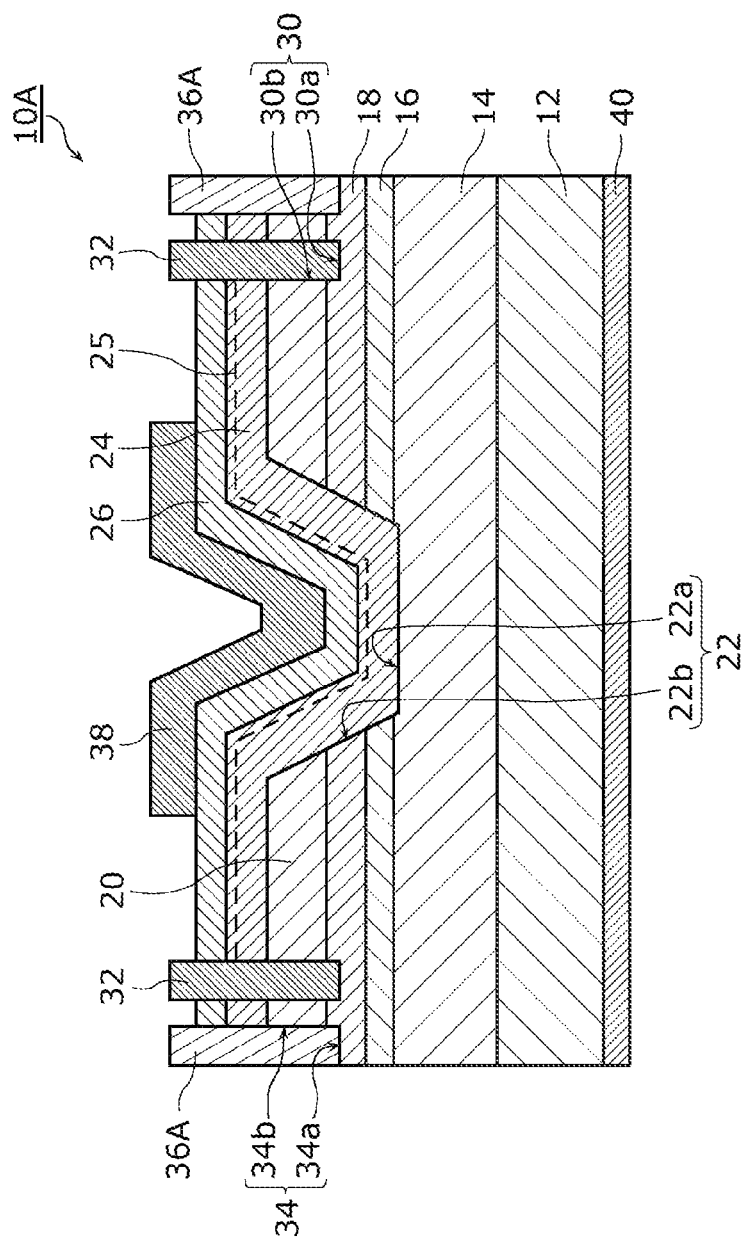
FIG. 5 is a cross-sectional view of a nitride semiconductor device according to Variation 1 of Embodiment 1.

FIG. 5 is a cross-sectional view of nitride semiconductor device 10A according to the present variation. As shown by FIG. 5, nitride semiconductor device 10A differs from nitride semiconductor device 10 according to Embodiment 1 in including potential fixing electrode 36A instead of potential fixing electrode 36.

As shown by FIG. 5, potential fixing electrode 36A is formed using a material different from the material of potential fixing electrode 36. Specifically, potential fixing electrode 36A is formed using a material in Schottky contact with first base layer 18. To put it another way, Ti/Al etc. can be used as a material in Schottky contact with a p-type semiconductor.

Consequently, potential fixing electrode 36A and first base layer 18 form a Schottky barrier diode. The Schottky barrier diode is connected in series and in the reverse direction to the parasitic p-n diode (i.e., the anodes are connected to each other). Accordingly, a rise voltage of the parasitic p-n diode is high due to the reverse characteristics of the Schottky barrier diode, compared to when potential fixing electrode 36 and first base layer 18 are in ohmic contact. For this reason, it is possible to prevent current from flowing through the parasitic p-n diode, which makes it possible to suppress a decrease in breakdown voltage.

[Variation 2]

Next, Variation 2 of Embodiment 1 will be described.

Figure 6:
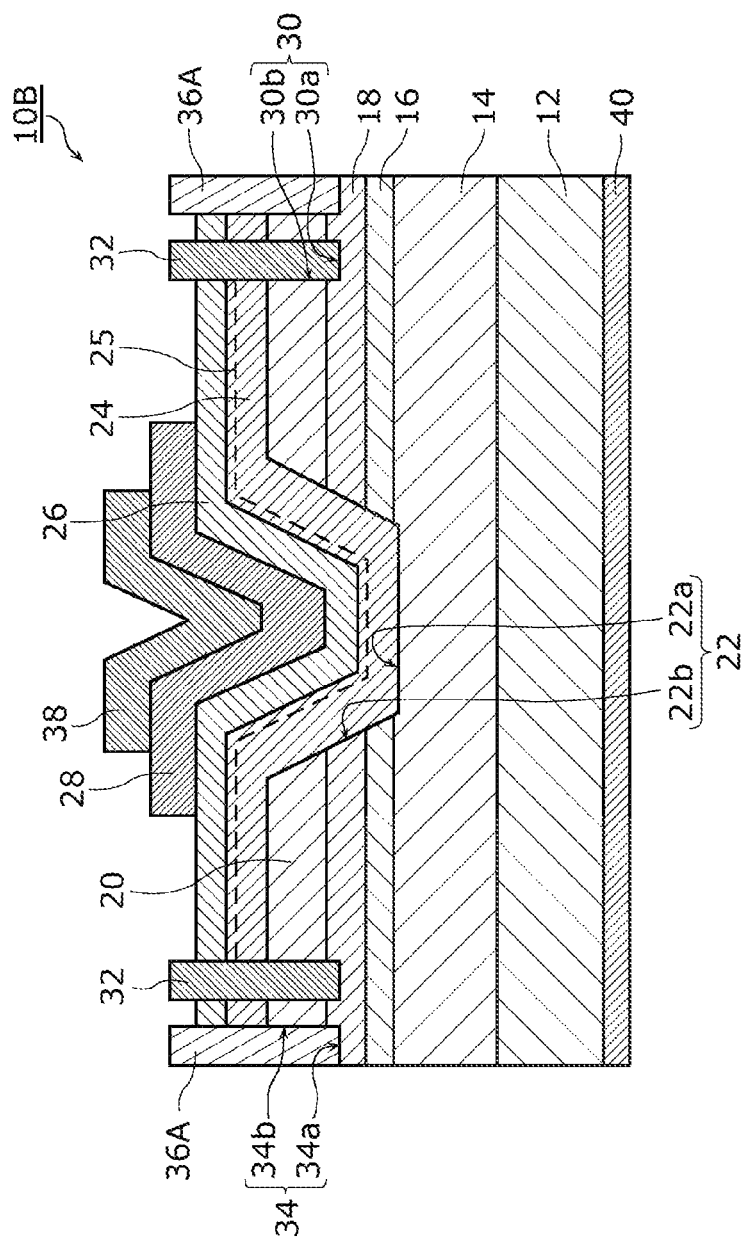
FIG. 6 is a cross-sectional view of a nitride semiconductor device according to Variation 2 of Embodiment 1.

FIG. 6 is a cross-sectional view of nitride semiconductor device 10B according to the present variation. As shown by FIG. 6, nitride semiconductor device 10B differs from nitride semiconductor device 10A according to Variation 1 in including threshold adjustment layer 28.

As shown by FIG. 6, threshold adjustment layer 28 is an example of a second p-type nitride semiconductor layer provided between gate electrode 38 and electron supply layer 26. Threshold adjustment layer 28 is in contact with the top face of electron supply layer 26 and a bottom face of gate electrode 38.

Threshold adjustment layer 28 is, for example, a nitride semiconductor layer formed from p-type AlGaN with a thickness of 100 nm and a carrier concentration of $1 \times 10^{17}$ $cm^{-3}$. Threshold adjustment layer 28 is formed through MOVPE and patterning, after the process of forming electron supply layer 26.

According to the present variation, threshold adjustment layer 28 increases the potential at the end of the conducting band of the channel part. For this reason, it is possible to increase the threshold voltage of nitride semiconductor device 10B. In other words, it is possible to allow nitride semiconductor device 10B to operate as a normally-off FET.

It should be noted that threshold adjustment layer 28 need not be a p-type nitride semiconductor. For example, threshold adjustment layer 28 may be formed using an insulating material such as silicon nitride (SiN) or silicon oxide ($SiO_2$). Stated differently, such a material is not particularly limited as long as the material has an effect of increasing a potential of a channel.

In addition, nitride semiconductor device 10 shown by FIG. 3 may include threshold adjustment layer 28.

Embodiment 2

Embodiment 2 will be described next.

A nitride semiconductor device according to Embodiment 2 mainly differs from Embodiment 1 in including a second high-resistance layer above a first p-type nitride semiconductor layer. The following descriptions will focus on the differences from Embodiment 1, and descriptions of common points will be omitted or simplified.

Figure 7:
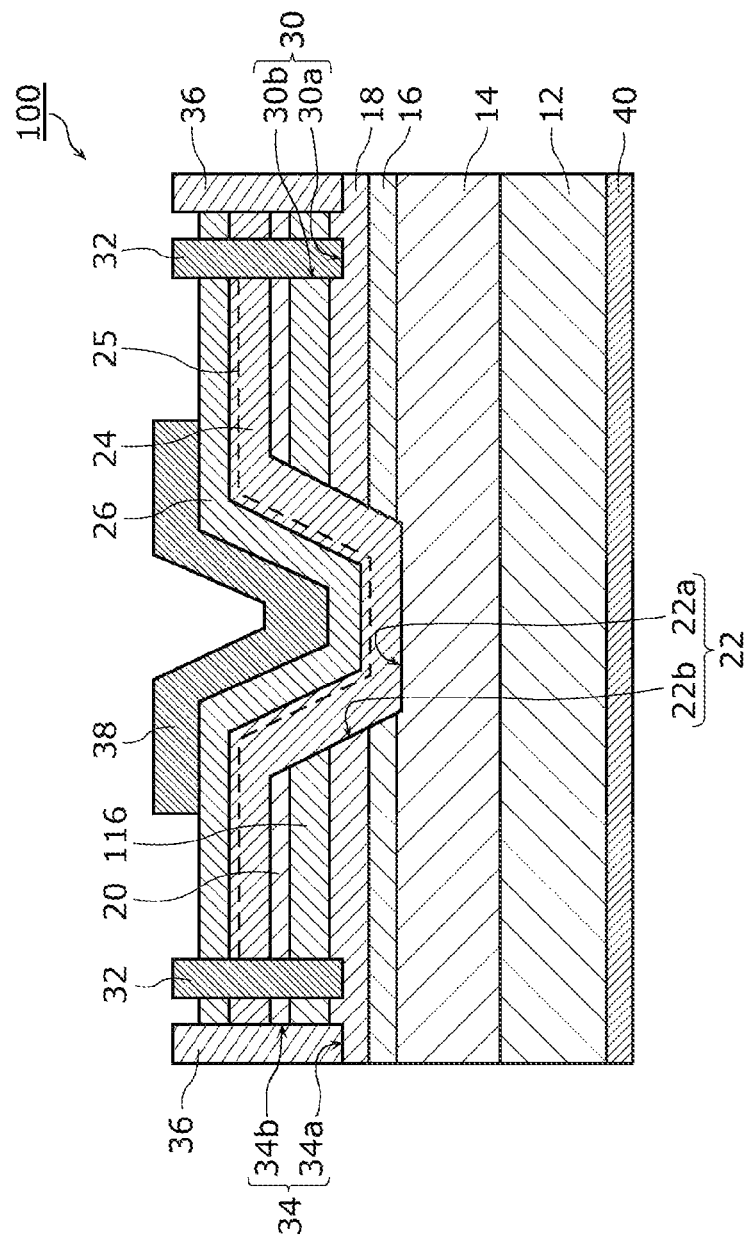
FIG. 7 is a cross-sectional view of a nitride semiconductor device according to Embodiment 2.
Figure 8:
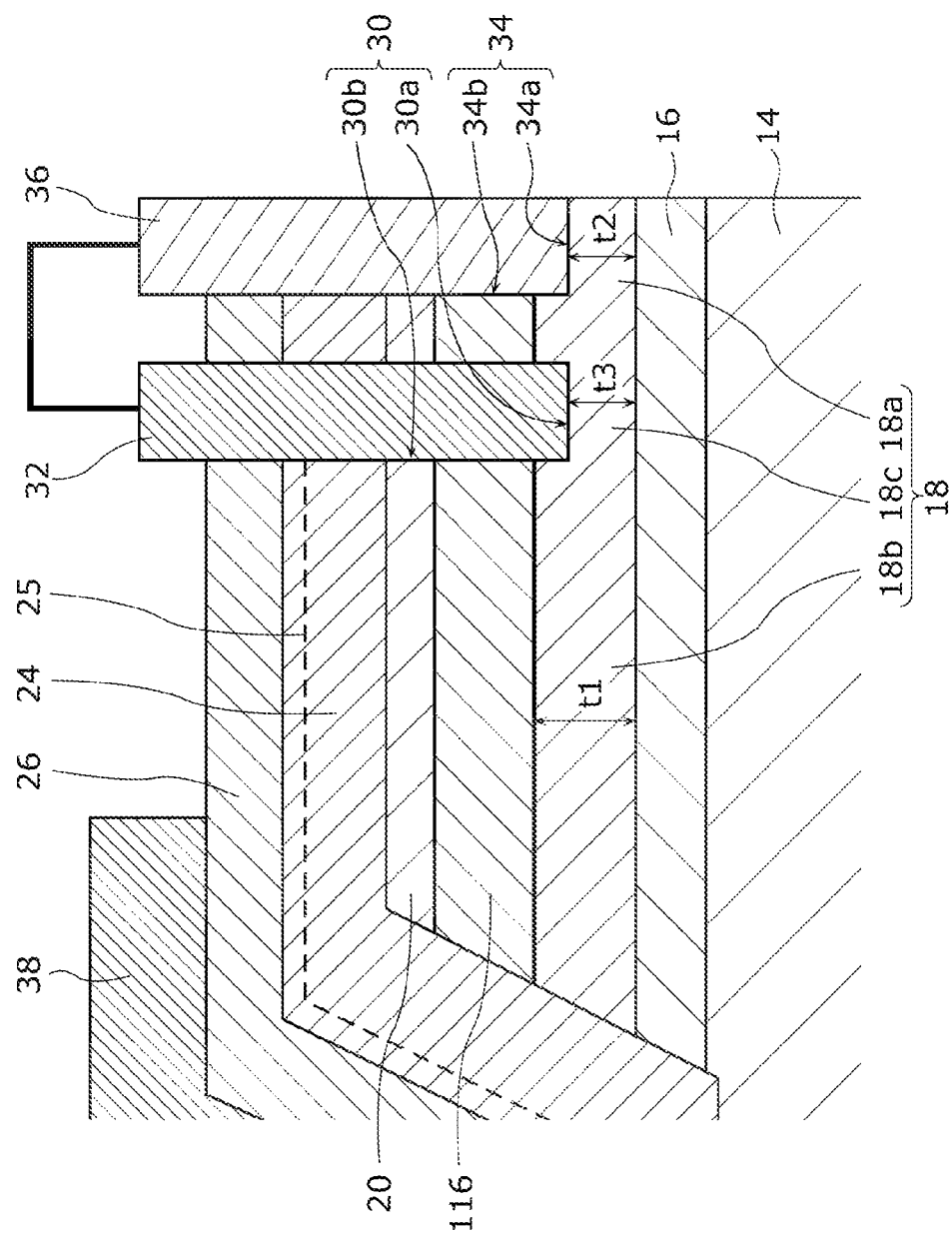
FIG. 8 is an enlarged partial cross-sectional view of the vicinity of a potential fixing electrode of the nitride semiconductor device according to Embodiment 2.

FIG. 7 is a cross-sectional view of nitride semiconductor device 100 according to the present embodiment. FIG. 8 is an enlarged partial cross-sectional view of the vicinity of potential fixing electrode 36 of nitride semiconductor device 100 according to the present embodiment.

As shown by FIG. 7, nitride semiconductor device 100 differs from nitride semiconductor device 10 according to Embodiment 1 in including high-resistance layer 116. High-resistance layer 116 is an example of the second high-resistance layer provided above first base layer 18. High-resistance layer 116 has a resistance higher than a resistance of first base layer 18. Additionally, high-resistance layer 116 has the resistance higher than a resistance of second base layer 20. High-resistance layer 116 is provided in contact with a top face of first base layer 18 and a bottom face of second base layer 20. High-resistance layer 116 is 200 nm thick, for example.

As with high-resistance layer 16, high-resistance layer 116 is a GaN layer containing carbon or an undoped GaN layer. Although high-resistance layer 116 has the same carbon concentration as high-resistance layer 16, high-resistance layer 116 may have a carbon concentration different from a carbon concentration of high-resistance layer 16. High-resistance layer 116 is formed using the same forming method as high-resistance layer 16.

In the present embodiment, since high-resistance layer 116 is provided, gate opening 22 penetrates through second base layer 20, high-resistance layer 116, first base layer 18, and high-resistance layer 16 to drift layer 14. An end face of high-resistance layer 116 is part of side wall part 22*b* of gate opening 22. Additionally, source opening 30 and electrode opening 34 penetrate through electron supply layer 26, electron transport layer 24, second base layer 20, and high-resistance layer 116 to first base layer 18. An end face of high-resistance layer 116 is part of each of side wall part 30*b* of source opening 30 and side wall part 34*b* of electrode opening 34.

If high-resistance layers 16 and 116 are not provided, second base layer 20 of n-type, first base layer 18 of p-type, and drift layer 14 of n-type form a parasitic bipolar transistor having a parasitic npn structure. When current flows through first base layer 18 in the case where nitride semiconductor device 100 is in an OFF-state, the parasitic bipolar transistor is switched ON, which may cause a decrease in breakdown voltage of nitride semiconductor device 100. In this case, nitride semiconductor device 100 is more likely to malfunction.

Since high-resistance layer 116 is provided, it is possible to prevent this parasitic npn structure from being formed. Accordingly, it is possible to suppress a decrease in breakdown voltage of nitride semiconductor device 100.

It should be noted that, also in the present embodiment, as shown by FIG. 8, first base layer 18 includes contact portions 18*a* and 18*c* and non-contact portion 18*b*. Thickness t1 of non-contact portion 18*b*, thickness t2 of contact portion 18*a*, and thickness t3 of contact portion 18*c* have the same relationship as described in Embodiment 1. Here, non-contact portion 18*b* has the same shape in a plan view as a contact face between first base layer 18 and high-resistance layer 116. Thickness t1 of non-contact portion 18*b* is a distance from the bottom face of first base layer 18 (specifically, the interface between first base layer 18 and high-resistance layer 16) to the top face of first base layer 18 (specifically, an interface between first base layer 18 and high-resistance layer 116).

[Variation]

Next, a variation of Embodiment 2 will be described.

Figure 9:
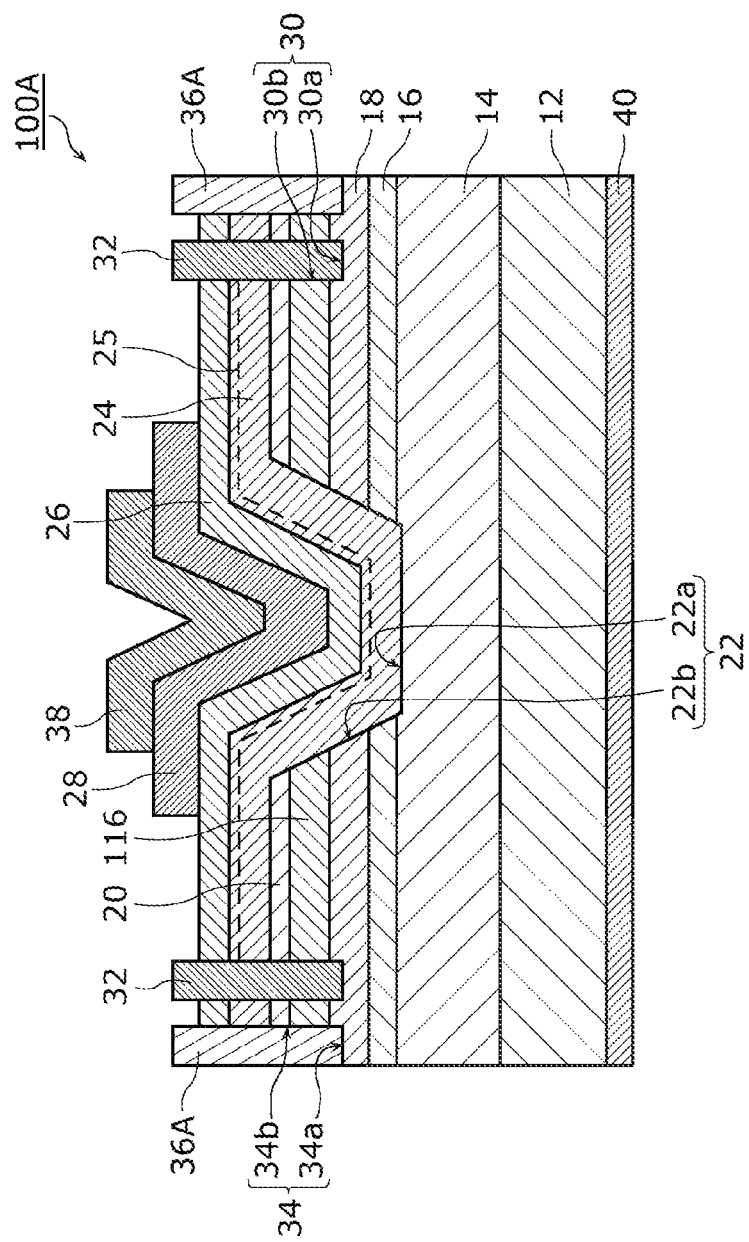
FIG. 9 is a cross-sectional view of a nitride semiconductor device according to a variation of Embodiment 2.

FIG. 9 is a cross-sectional view of nitride semiconductor device 100A according to the present variation. As shown by FIG. 9, nitride semiconductor device 100A differs from nitride semiconductor device 100 according to Embodiment 2 in including threshold adjustment layer 28 and including potential fixing electrode 36A instead of potential fixing electrode 36.

Threshold adjustment layer 28 is the same as described in Variation 2 of Embodiment 1. Since nitride semiconductor device 100A includes threshold adjustment layer 28, it is possible to allow nitride semiconductor device 100A to operate as a normally-off FET.

Potential fixing electrode 36A is the same as described in Variation 1 of Embodiment 1. Since potential fixing electrode 36A and first base layer 18 form a Schottky barrier diode, it is possible to prevent current from flowing through a parasitic p-n diode, which makes it possible to suppress a decrease in breakdown voltage.

It should be noted that nitride semiconductor device 100A need not include threshold adjustment layer 28. Alternatively, nitride semiconductor device 100A may include potential fixing electrode 36 instead of potential fixing electrode 36A.

Embodiment 3

Embodiment 3 will be described next.

A nitride semiconductor device according to Embodiment 3 mainly differs from Embodiment 2 in not including the first high-resistance layer. The following descriptions will focus on the differences from Embodiment 2, and descriptions of common points will be omitted or simplified.

Figure 10:
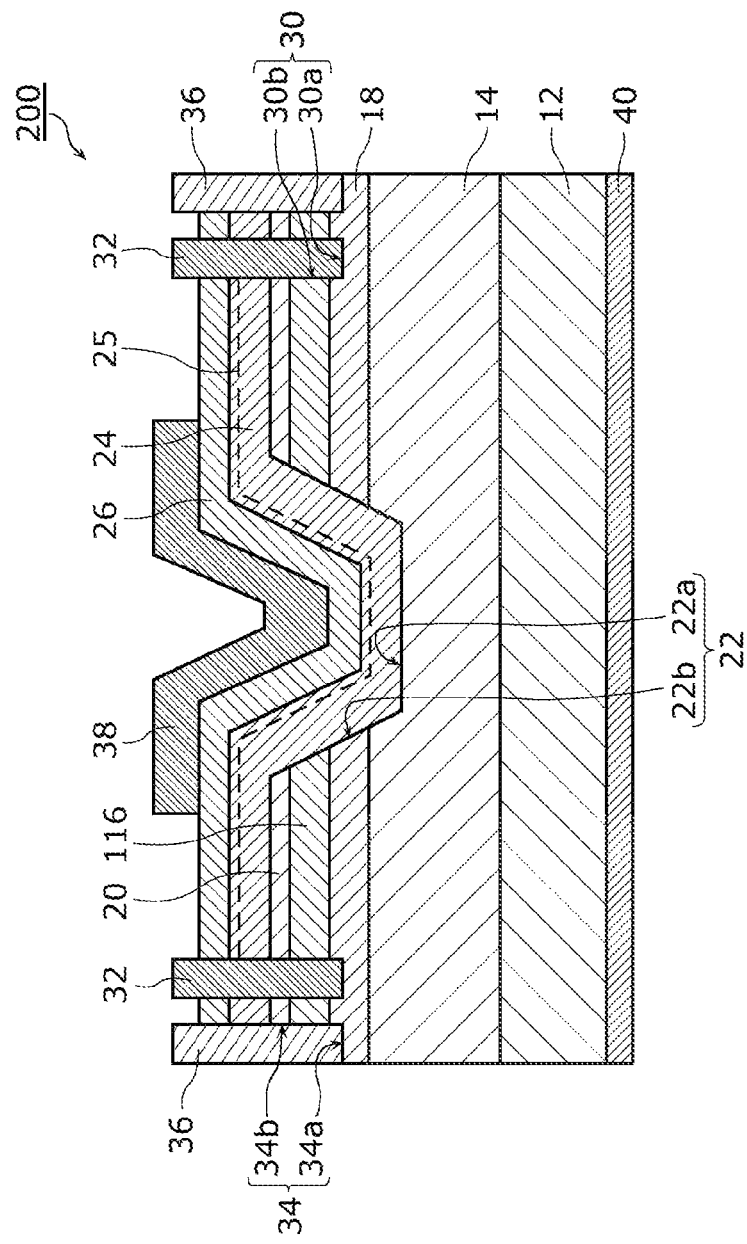
FIG. 10 is a cross-sectional view of a nitride semiconductor device according to Embodiment 3.
Figure 11:
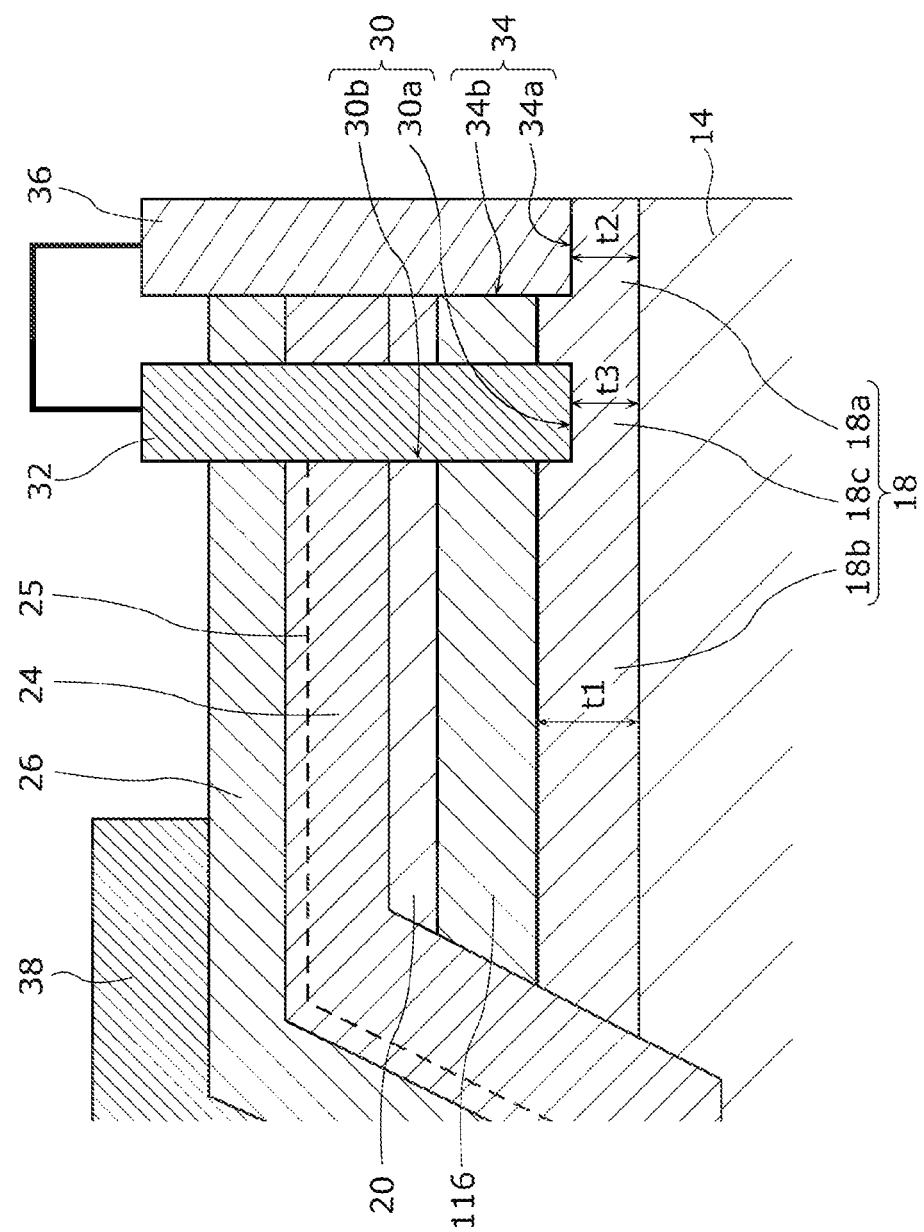
FIG. 11 is an enlarged partial cross-sectional view of the vicinity of a potential fixing electrode of the nitride semiconductor device according to Embodiment 3.

FIG. 10 is a cross-sectional view of nitride semiconductor device 200 according to the present embodiment. FIG. 11 is an enlarged partial cross-sectional view of the vicinity of potential fixing electrode 36 of nitride semiconductor device 200 according to the present embodiment.

As shown by FIG. 10, nitride semiconductor device 200 does not include high-resistance layer 16 shown by FIG. 7. As with Embodiments 1 and 2, in the present embodiment, as shown by FIG. 11, first base layer 18 includes contact portions 18*a* and 18*c* and non-contact portion 18*b*. Thickness t1 of non-contact portion 18*b*, thickness t2 of contact portion 18*a*, and thickness t3 of contact portion 18*c* have the same relationship as described in Embodiments 1 and 2. In other words, thickness t1 is at least 400 nm, and thickness t2 and thickness t3 are at least 50 percent of thickness t1.

Here, thickness t1 of non-contact portion 18*b* is a distance from the bottom face of first base layer 18 (specifically, an interface between first base layer 18 and drift layer 14) to the top face of first base layer 18 (specifically, the interface between first base layer 18 and high-resistance layer 116). Moreover, thickness t2 of contact portion 18*a* is a distance from the bottom face of first base layer 18 (specifically, the interface between first base layer 18 and drift layer 14) to bottom part 34*a*. Thickness t3 of contact portion 18*c* is a distance from the bottom face of first base layer 18 (specifically, the interface between first base layer 18 and drift layer 14) to bottom part 30*a*.

This makes it possible to keep the damage layers located in the surface parts of contact portions 18*a* and 18*c* away from the parasitic p-n junction. As a result, it is possible to suppress a decrease in breakdown voltage due to the damage layers.

[Variation]

Next, a variation of Embodiment 3 will be described.

Figure 12:
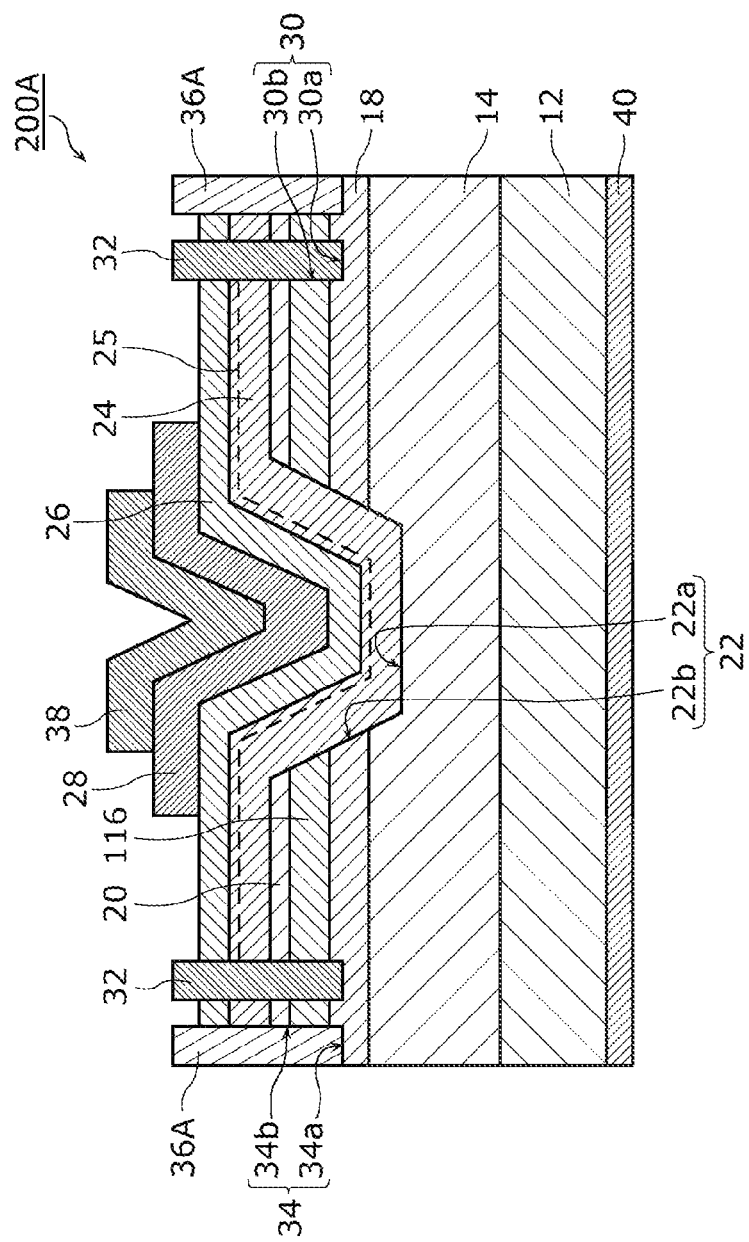
FIG. 12 is a cross-sectional view of a nitride semiconductor device according to a variation of Embodiment 3.

FIG. 12 is a cross-sectional view of nitride semiconductor device 200A according to the present variation. As shown by FIG. 12, nitride semiconductor device 200A differs from nitride semiconductor device 200 according to Embodiment 3 in including threshold adjustment layer 28 and including potential fixing electrode 36A instead of potential fixing electrode 36.

Threshold adjustment layer 28 is the same as described in Variation 2 of Embodiment 1. Since nitride semiconductor device 200A includes threshold adjustment layer 28, it is possible to allow nitride semiconductor device 200A to operate as a normally-off FET.

Potential fixing electrode 36A is the same as described in Variation 1 of Embodiment 1. Since potential fixing electrode 36A and first base layer 18 form a Schottky barrier diode, it is possible to prevent current from flowing through a parasitic p-n diode, which makes it possible to suppress a decrease in breakdown voltage.

It should be noted that nitride semiconductor device 200A need not include threshold adjustment layer 28. Alternatively, nitride semiconductor device 200A may include potential fixing electrode 36 instead of potential fixing electrode 36A.

Other Embodiments

Although one or more aspects of a nitride semiconductor device have been described thus far on the basis of embodiments, the present disclosure is not intended to be limited to these embodiments. Forms obtained by various modifications to each of the aforementioned embodiments that can be conceived by a person skilled in the art as well as other forms realized by combining elements in each of different embodiments are included in the scope of the present disclosure as long as they do not depart from the essence of the present disclosure.

For example, if a nitride semiconductor device includes potential fixing electrode 36A, the nitride semiconductor device need not include high-resistance layer 16. In addition, thickness t1 of non-contact portion 18b of first base layer 18 may be less than 400 nm. Alternatively, thickness t2 of contact portion 18a may be less than 50 percent of thickness t1.

Moreover, for example, when a nitride semiconductor device includes high-resistance layer 16, thickness t1 of non-contact portion 18b of first base layer 18 may be less than 400 nm. Alternatively, thickness t2 of contact portion 18a may be less than 50 percent of thickness t1.

Furthermore, for example, substrate 12 need not be a nitride semiconductor substrate. For example, substrate 12 may be a silicon (Si) substrate, a silicon carbide (SiC) substrate, a zinc oxide (ZnO) substrate, or the like.

Moreover, for example, first base layer 18 may be formed not through crystal growth but by implanting Mg ions into i-GaN. Additionally, in nitride semiconductor device 200 or 200A to which high-resistance layer 16 is not provided, first base layer 18 may be an insulating layer formed by implanting Fe ions, not a p-type semiconductor layer Furthermore, for example, the nitride semiconductor device according to each of the embodiments and variations need not include second base layer 20.

Moreover, for example, the nitride semiconductor device according to each of the embodiments and variations need not include source opening 30. In this regard, however, since source electrode 32 and two-dimensional electron gas 25 can be brought into direct contact with each other by providing source opening 30, it is possible to reduce an ohmic contact resistance between source electrode 32 and the channel.

Furthermore, for example, source opening 30 and electrode opening 34 may be integrated into one opening. In other words, bottom part 30a of source opening 30 and bottom part 34a of electrode opening 34 may be connected and flush with each other. Source electrode 32 may be provided to cover a side wall part of the one opening, and potential fixing electrode 36 may be provided to cover at least part of a bottom part of the one opening. In addition, source electrode 32 and potential fixing electrode 36 may be in contact with each other. This makes it possible to easily fix a potential of potential fixing electrode 36 to a source potential.

It should be noted that potential fixing electrode 36 may be fixed to a potential different from the source potential.

Moreover, for example, a donor concentration need not be even in drift layer 14. For example, a donor concentration may be low in a surface part of drift layer 14, that is, the vicinity of an interface between drift layer 14 and high-resistance layer 16 or first base layer 18.

Forms obtained by various modifications to the respective embodiments that can be conceived by a person skilled in the art as well as forms realized by combining elements and functions in the respective embodiments are included in the scope of the present disclosure as long as they do not depart from the essence of the present disclosure.

INDUSTRIAL APPLICABILITY

The present disclosure can be used as a nitride semiconductor device capable of suppressing a decrease in breakdown voltage due to a reverse conductive operation, and can be used, for example, as a power device used in power circuitry etc. of consumer devices.

The invention claimed is:

1. A nitride semiconductor device comprising:
   a substrate;
   a first nitride semiconductor layer above the substrate;
   a first high-resistance layer above the first nitride semiconductor layer, the first high-resistance layer having a resistance higher than a resistance of the first nitride semiconductor layer;
   a first p-type nitride semiconductor layer above the first high-resistance layer;
   a first opening penetrating through the first p-type nitride semiconductor layer and the first high-resistance layer to the first nitride semiconductor layer;
   an electron transport layer and an electron supply layer provided in stated order from a substrate side, the electron transport layer and the electron supply layer covering an upper portion of the first p-type nitride semiconductor layer and the first opening;
   a gate electrode above the electron supply layer and covering the first opening;
   a source electrode away from the gate electrode and in contact with the electron supply layer;
   a second opening penetrating through the electron supply layer and the electron transport layer to the first p-type nitride semiconductor layer;
   a potential fixing electrode in contact with the first p-type nitride semiconductor layer at a bottom part of the second opening; and
   a drain electrode below the substrate.

2. The nitride semiconductor device according to claim 1, wherein the first high-resistance layer is a GaN layer containing carbon.

3. The nitride semiconductor device according to claim 1, wherein the first high-resistance layer is an undoped GaN layer.

4. The nitride semiconductor device according to claim 1, wherein the potential fixing electrode includes a material in Schottky contact with the first p-type nitride semiconductor layer.

5. The nitride semiconductor device according to claim 1, wherein a contact portion of the first p-type nitride semiconductor layer which is in contact with the potential fixing electrode has a thickness greater than or equal to 50 percent of a thickness of a non-contact portion of the first p-type nitride semiconductor layer which is not in contact with the potential fixing electrode, and the thickness of the non-contact portion is greater than or equal to 400 nm.

6. The nitride semiconductor device according to claim 1, further comprising:

a second p-type nitride semiconductor layer between the gate electrode and the electron supply layer.

7. The nitride semiconductor device according to claim 1, further comprising:

a second high-resistance layer above the first p-type nitride semiconductor layer, the second high-resistance layer having a resistance higher than a resistance of the first p-type nitride semiconductor layer, wherein the first opening further penetrates through the second high-resistance layer, and the electron transport layer and the electron supply layer cover an upper portion of the second high-resistance layer.

8. The nitride semiconductor device according to claim 1, wherein the potential fixing electrode is electrically connected to the source electrode.

9. A nitride semiconductor device comprising:

a substrate;

a first nitride semiconductor layer above the substrate;

a first p-type nitride semiconductor layer above the first nitride semiconductor layer;

a first opening penetrating through the first p-type nitride semiconductor layer to the first nitride semiconductor layer;

an electron transport layer and an electron supply layer provided in stated order from a substrate side, the electron transport layer and the electron supply layer covering an upper portion of the first p-type nitride semiconductor layer and the first opening;

a gate electrode above the electron supply layer and covering the first opening;

a source electrode away from the gate electrode and in contact with the electron supply layer;

a second opening penetrating through the electron supply layer and the electron transport layer to the first p-type nitride semiconductor layer;

a potential fixing electrode in contact with the first p-type nitride semiconductor layer at a bottom part of the second opening; and a drain electrode below the substrate, wherein the potential fixing electrode includes a material in Schottky contact with the first p-type nitride semiconductor layer.

10. A nitride semiconductor device comprising:

a substrate;

a first nitride semiconductor layer above the substrate;

a first p-type nitride semiconductor layer above the first nitride semiconductor layer;

a first opening penetrating through the first p-type nitride semiconductor layer to the first nitride semiconductor layer;

an electron transport layer and an electron supply layer provided in stated order from a substrate side, the electron transport layer and the electron supply layer covering an upper portion of the first p-type nitride semiconductor layer and the first opening;

a gate electrode above the electron supply layer and covering the first opening;

a source electrode away from the gate electrode and in contact with the electron supply layer;

a second opening penetrating through the electron supply layer and the electron transport layer to the first p-type nitride semiconductor layer;

a potential fixing electrode in contact with the first p-type nitride semiconductor layer at a bottom part of the second opening; and a drain electrode below the substrate, wherein:

a contact portion of the first p-type nitride semiconductor layer which is in contact with the potential fixing electrode has a thickness greater than or equal to 50 percent of a thickness of a non-contact portion of the first p-type nitride semiconductor layer which is not in contact with the potential fixing electrode, the thickness of the non-contact portion is greater than or equal to 400 nm, and the potential fixing electrode includes a material in Schottky contact with the first p-type nitride semiconductor layer.

* * * * *